US012726205B2

(12) United States Patent
Ng et al.

(10) Patent No.: US 12,726,205 B2
(45) Date of Patent: Sep. 1, 2026

(54) DIGITAL DELAY LINE OF A MEMORY SYSTEM AND METHOD OF ADJUSTING TIMING OF CLOCKS USING THEREOF

(71) Applicant: SKYECHIP BERHAD, Bayan Lepas (MY)

(72) Inventors: Hoong Chin Ng, Bayan Lepas (MY); How Hwan Wong, Bayan Lepas (MY)

(73) Assignee: SKYECHIP BERHAD (MY)

( * ) Notice: Subject to any disclaimer, the term of this patent is extended or adjusted under 35 U.S.C. 154(b) by 0 days.

(21) Appl. No.: 18/887,293

(22) Filed: Sep. 17, 2024

(65) Prior Publication Data

US 2025/0240022 A1 Jul. 24, 2025

(30) Foreign Application Priority Data

Jan. 24, 2024 (MY) ............................ PI2024000530

(51) Int. Cl.

*H03L 7/00* (2006.01)
*H03L 7/081* (2006.01)
*H03L 7/099* (2006.01)
*H03L 7/14* (2006.01)

(52) U.S. Cl.

CPC .......... *H03L 7/0818* (2013.01); *H03L 7/0998* (2013.01); *H03L 7/148* (2013.01)

(58) Field of Classification Search

CPC ..... H03K 2005/00013; H03K 5/00019; H03K 5/00058; H03K 5/13; H03K 5/133; H03K 5/134; H03K 5/135; H03K 5/15; H03K 5/15013; H03K 5/1502; H03L 7/0818; H03L 7/0998; H03L 7/148; G11C 7/222; G11C 7/22; G11C 8/10

See application file for complete search history.

(56) References Cited

U.S. PATENT DOCUMENTS

| | | | | |
|---|---|---|---|---|
| 6,037,818 A * | 3/2000 | Sato | H03K 5/135 | 327/272 |
| 6,259,330 B1 * | 7/2001 | Arai | H03L 7/0997 | 331/177 R |
| 7,911,873 B1 * | 3/2011 | Menon | G11C 7/1066 | 365/194 |
| 8,493,116 B2 | 7/2013 | Choi et al. | | |
| 8,713,331 B2 * | 4/2014 | Kitagawa | G11C 7/222 | 327/158 |
| 2012/0008726 A1 * | 1/2012 | Jeon | H03L 7/0818 | 375/376 |
| 2021/0006254 A1 * | 1/2021 | Kim | G11C 7/1066 | |

* cited by examiner

*Primary Examiner* — Tuan T Lam

(74) *Attorney, Agent, or Firm* — Jayne Saydah

(57) ABSTRACT

The invention relates to a digital delay line of a memory system is characterized by: a coarse delay line receiving a high-speed input clock; and a fine delay line transmitting an interface output clock to transceivers; wherein the coarse delay line is configured to perform clock division from a frequency of the high-speed input clock to a frequency of the interface output clock and to delay divided output clock; wherein the coarse delay line comprising a dual-edge triggered flip-flop to produce a shifted divided clock and a clock mux to bypass the high-speed input clock when delay shifting is not needed; wherein the fine delay line is configured to provide a finer delay step size. Further, a method of adjusting the timing of clocks within a memory system using a digital delay line of a memory system is also disclosed.

11 Claims, 2 Drawing Sheets

DIGITAL DELAY LINE OF A MEMORY SYSTEM AND METHOD OF ADJUSTING TIMING OF CLOCKS USING THEREOF

CROSS-REFERENCE TO RELATED APPLICATIONS

This application claims priority to and the benefit of Malaysian Patent Application No. PI2024000530 filed in the Malaysian Intellectual Property Office on Jan. 24, 2024, the entire contents of which are incorporated herein by reference its entirety.

TECHNICAL FIELD

The present invention relates generally to a memory system. More particularly, the present invention relates to a digital delay line by using dual edge-triggered clock counter of a memory system for dynamic delay shifting with low latency and wide output frequency range.

BACKGROUND ART

The operating clock frequency range can range from hundreds of MHz to several GHz for memory subsystems that need to integrate multiple standards and meet backward compatibility requirements. The delay stages of the delay chain must be long enough to reach the required delay range of the lowest operating clock frequency with the conventional delay-cell based delay line design. This causes significant area and power usage in the memory subsystem.

The existing solution is using single edge triggered flip-flops which is not able to provide dynamic coarse delay shifting due to individual clock counters for rising and falling clock counts with high latency.

There have been several solutions provided to improve the memory system in particular timing adjustment for desired performance, and one of them has been discussed below:

U.S. Pat. No. 8,493,116B2 discloses a digital delay line includes a plurality of delay cells. The delay line is configured to delay a periodic signal received at the first input thereof by passing the periodic signal through a selected number of the plurality of delay cells in response to a discontinuous thermometer code that encodes the selected number. A code converter is provided, which includes a group bit decoder, a shared bit decoder, and a code output cell array, which are collectively configured to generate the discontinuous thermometer code in response to a binary control code.

The aforementioned reference provides a digital delay line includes a plurality of delay cells. Nevertheless, it still has a number of limitations and shortcomings, such as the digital delay line comprises of NAND based delay cells. The number of delay cells stages will be significant if the operating clock frequency is low. It will consume significant power as well when the number of delay cell stages is large. In this invention, the delay cell based delay line range that provides the fine delay shifting only needs to meet the largest coarse delay step size across the operation clock frequencies while the coarse delay shifting is provided by dual-edge triggered clock counter with minimal latency and power.

SUMMARY OF THE INVENTION

The following presents a simplified summary of the invention in order to provide a basic understanding of some aspects of the invention. This summary is not an extensive overview of the invention. Its sole purpose is to present some concepts of the invention in a simplified form as a prelude to the more detailed description that is presented later.

It is an objective of the present invention to provide a digital delay line with dual edge-triggered clock counter to introduce dynamic coarse delay shifting with low latency.

It is further an objective of the present invention to provide a digital delay line to reduce delay line latency, area, and power with a wide output clock frequency range.

Accordingly, these objectives may be achieved by following the teachings of the present invention. The invention relates to a digital delay line of a memory system characterized by: a coarse delay line receiving a high-speed input clock; and a fine delay line transmitting an interface output clock to transceivers; wherein the coarse delay line is configured to perform clock division from a frequency of the high-speed input clock to a frequency of the interface output clock and to delay divided output clock; wherein the coarse delay line comprising dual edge-triggered clock counter to produce a shifted divided clock; and a clock mux to bypass the high-speed input clock is provided when delay shifting is not needed to reduce the clock path latency; wherein the fine delay line is configured to provide a finer delay step size.

The present invention also discloses a method of adjusting the timing of clocks within a memory system, comprising the steps of: counting clock position of high-speed input clock's edges within one unit interval of divided clock by a counter; generating edges of the divided clock based on a clock sub-unit interval position controlled by a delay code; calculating and re-calculating falling edge sub-unit interval position according to the delay code; and outputting the counter's count value by a dual edge triggered flip-flop when the counter's count value matches the rising or falling edge position to produce shifted divided clock.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

So that the manner in which the above recited features of the present invention can be understood in detail, a more particular description of the invention, briefly summarized above, may have been referred by embodiments, some of which are illustrated in the appended drawings. It is to be noted, however, that the appended drawings illustrate only typical embodiments of this invention and are therefore not to be considered limiting of its scope, for the invention may admit to other equally effective embodiments.

These and other features, benefits, and advantages of the present invention will become apparent by reference to the following text figures, with like reference numbers referring to like structures across the views, wherein.

DETAILED DESCRIPTION OF THE INVENTION

Figure 1:
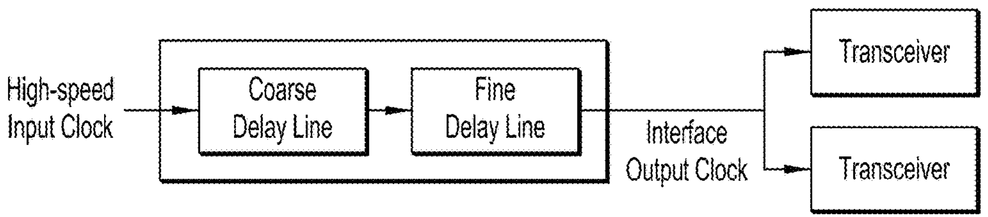
FIG. 1 is a diagram illustrating a digital delay line in accordance with an embodiment of the present invention.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modifications, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field.

The present invention is described hereinafter by various embodiments with reference to the accompanying drawings, wherein reference numerals used in the accompanying drawings correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the invention.

Referring to the drawings, the invention will now be described in more details.

The invention relates to a digital delay line of a memory system, characterized by: a coarse delay line receiving a high-speed input clock; and a fine delay line transmitting an interface output clock to transceivers; wherein the coarse delay line is configured to perform clock division from a frequency of the high-speed input clock to a frequency of the interface output clock and to delay divided output clock; wherein the coarse delay line comprising dual-edge triggered clock counter to produce a shifted divided clock; a clock mux to bypass the high-speed input clock is provided when delay shifting is not needed to reduce the clock path latency; wherein the fine delay line is configured to provide a finer delay step size. The digital delay line of the present invention is shown in FIG. 1.

In accordance with an embodiment of the present invention, the frequency of the high-speed input clock is equal to or greater than the frequency of the interface output clock.

In accordance with an embodiment of the present invention, the frequency of the high-speed input clock is equal to the frequency of the interface output clock, to bypass the high-speed input clock, whereas the frequency of the high-speed input clock is greater than the frequency of the interface output clock, to divided down the input clock.

In accordance with an embodiment of the present invention, the divided output clock maximum delay range comprises of two times of clock division minus one.

In accordance with an embodiment of the present invention, each of the step size comprising a sub-unit interval resolution.

In accordance with an embodiment of the present invention, the sub-unit interval resolution is half of a period of the high-speed input clock.

In accordance with an embodiment of the present invention, the fine delay line comprises of delay cells with a delay range of one period of the highest supported frequency of the high-speed input clock.

In accordance with an embodiment of the present invention, the coarse delay line further comprises of a dual-edge triggered clock counter incorporated with logics for rising position and falling position count compare, a falling position adder, and a delay code synchronization logic.

In accordance with an embodiment of the present invention, the fine delay line comprising a delay-cell chain including a NAND gate delay cell and a phase interpolator.

The present invention also discloses a method of adjusting the timing of clocks within a memory system, comprising the steps of: counting clock position of high-speed input clock's edges within one unit interval of divided clock by a counter; generating edges of the divided clock based on a clock sub-unit interval position controlled by a delay code; calculating and re-calculating falling edge sub-unit interval position according to the delay code; and outputting the counter's count value by a dual edge triggered flip-flop when the counter's count value matches the rising or falling edge position to produce shifted divided clock.

In accordance with an embodiment of the present invention, the method further comprises synchronizing dynamically changing delay code to the divided clock domain. Synchronizers are added to the delay code bus signals as dynamically changing delay codes can cause clock glitch at the shifted divided clock and this is an issue to the downstream logic.

In accordance with an embodiment of the present invention, the method further comprises bypassing the high-speed input clock when delay shifting is not needed. A mux is added at the course delay line output to select between shifted divided clock or high speed input clock.

Hereinafter, examples of the present invention will be provided for more detailed explanation. The advantages of the present invention may be more readily understood and put into practical effect from these examples. However, it is to be understood that the following examples are not intended to limit the scope of the present invention in any ways.

EXAMPLES

Table 1 shows example of coarse delay line (CDL) configurations in accordance with the present invention in supporting a wide range output clock frequency.

TABLE 1

| High-speed Input Clock (MHz) | Interface Output Clock (MHz) | CDL Division | CDL Sub-UI Size (ps) |
|---|---|---|---|
| 4000 | 4000 | 1 | 125.000 |
| 3600 | 3600 | 1 | 138.889 |
| 3200 | 3200 | 1 | 156.250 |
| 2800 | 2800 | 1 | 178.571 |
| 2400 | 2400 | 1 | 208.333 |
| 4000 | 2000 | 2 | 125.000 |
| 3200 | 1600 | 2 | 156.250 |
| 2400 | 1200 | 2 | 208.333 |
| 2400 | 800 | 3 | 208.333 |
| 2400 | 400 | 6 | 208.333 |
| 2400 | 200 | 12 | 208.333 |
| 2400 | 100 | 24 | 208.333 |
| 2400 | 50 | 48 | 208.333 |
| 2400 | 25 | 96 | 208.333 |

Figure 2:
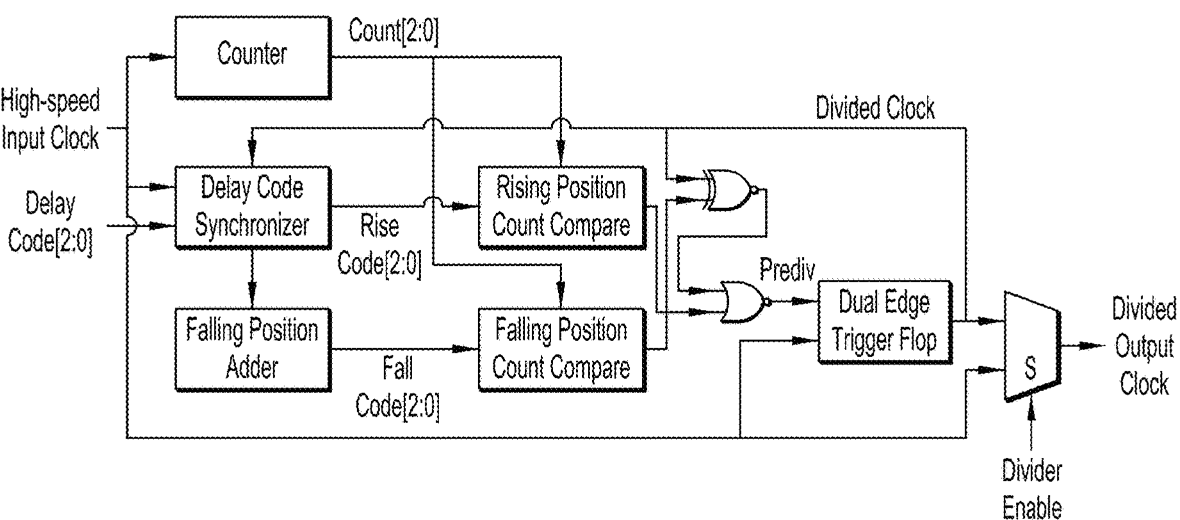
FIG. 2 is a diagram illustrating elements and data flows of the coarse delay line in accordance with an embodiment of the present invention.
Figure 3:
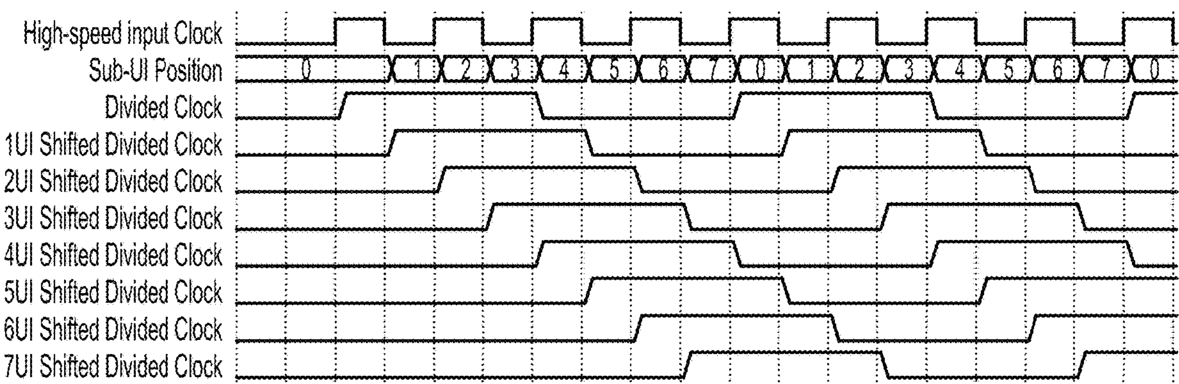
FIG. 3 shows a timing diagram of the coarse delay line in accordance with an embodiment of the present invention.
Figure 4:
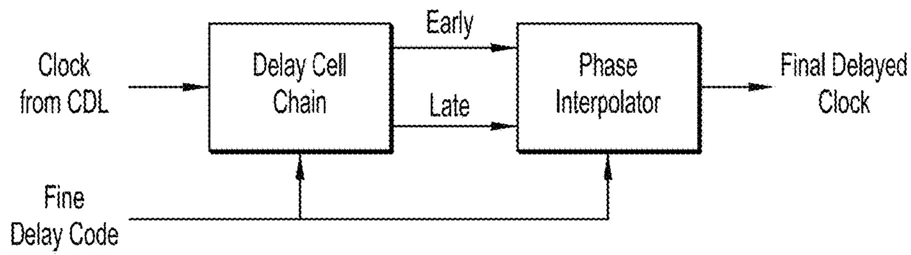
FIG. 4 a diagram illustrating elements and data flows of the fine delay line in accordance with an embodiment of the present invention.

FIG. 2 shows an example of a CDL design of the present invention with clock division up to four. The counter uses a dual-edge triggered flip flop to count the clock position of the high-speed input clock's edges within one unit interval (UI) of the divided clock. The edges of the divided clock are generated based on the clock sub-UI position, which is controlled by a delay code [3:0]. The delay code [3:0] determines the rising edge sub-UI position of the divided clock, while the falling edge sub-UI position will be calculated by the Falling Position Adder logic. The falling edge sub-UI position will be recalculated whenever the delay code [3:0] has changed. The Rising/Falling Position Count Compare logic will trigger when the counter's count value matches the rising or falling edge position. This output will be sampled by a dual-edge triggered flip flop to produce the shifted divided clock. There is a delay code synchronizer to synchronize the dynamically changing delay code to the divided clock domain to avoid clock glitches at the output. The timing diagram of the CDL is shown in FIG. 3. There is a clock MUX at the output where we can bypass the high-speed input clock when CDL delay shifting is not needed.

Low clock latency is a crucial metric in high-speed clocking design. This invention provides very low clock latency, where the clock latency components only consist of a dual-edge triggered flip flop, a MUX, and a minimum delay stage of fine delay line (FDL). Furthermore, the jitter of the shifted divided clock stays similar when the clock division and delay code increase as it is resampled at the dual-edge triggered flip flop using a high-speed clock.

To achieve a finer delay step size, FDL is added after the CDL in this invention. The delay-cell chain consists of a NAND gate delay cell and a phase interpolator (PI) to interpolate the phase between the early and late clock signals. The delay range of FDL only needs to meet the one-step size of CDL to have clock overlapping between CDL delay codes. No additional delay stages are required if the implementation needs to support a lower operating clock frequency, as long as the frequency of the high-speed clock remains the same. This helps the memory interface achieve a wider operating frequency range without penalty of area or power.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A digital delay line of a memory system comprising:

a coarse delay line receiving a high-speed input clock; and a fine delay line transmitting an interface output clock to transceivers;

wherein the coarse delay line is configured to perform clock division of a frequency of the high-speed input clock to a frequency of the interface output clock;

wherein the coarse delay line comprises:

a dual-edge triggered flip-flop to produce a shifted divided clock, the dual-edge triggered flip-flop including logics for rising position and falling position count compare;

and a clock mux for selecting to bypass the high-speed input clock when delay shifting is not performed;

wherein the fine delay line is configured to provide a finer delay step size.

2. The digital delay line as claimed in claim 1, wherein the frequency of the high-speed input clock is equal to or greater than the frequency of the interface output clock.

3. The digital delay line as claimed in claim 1, wherein the divided output clock maximum delay range comprises of two times clock division minus one.

4. The digital delay line as claimed in claim 1, wherein each of the step size comprising a sub-unit interval resolution.

5. The digital delay line as claimed in claim 4, wherein the sub-unit interval resolution is half of a period of the high-speed input clock.

6. The digital delay line as claimed in claim 1, wherein the fine delay line comprises of delay cells with a delay range of one period of a highest supported frequency of the high-speed input clock.

7. The digital delay line as claimed in claim 1, wherein the coarse delay line further comprises a falling position adder, and a delay code synchronization logic.

8. The digital delay line as claimed in claim 1, wherein the fine delay line comprising a delay-cell chain including a NAND gate delay cell and a phase interpolator.

9. A method of adjusting a timing of clocks within a memory system using a digital delay line including:

a coarse delay line receiving a high-speed input clock; and a fine delay line transmitting an interface output clock to transceivers;

wherein the coarse delay line is configured to perform clock division of a frequency of the high-speed input clock to a frequency of the interface output clock;

wherein the coarse delay line comprises a dual-edge triggered flip-flop to produce a shifted divided clock and a clock mux configured to bypass the high-speed input clock when delay shifting is not performed;

wherein the fine delay line is configured to provide a finer delay step size, the method comprising:

counting clock position of high-speed input clock's edges within one unit interval of divided clock by a counter;

generating edges of the divided clock based on a clock sub-unit interval position controlled by a delay code;

calculating and re-calculating falling edge sub-unit interval position according to the delay code; and outputting a count value of the counter, by a dual edge triggered flip-flop, when the count value of the counter matches a rising or falling edge position to produce shifted divided clock.

10. The method of claim 9, wherein the method further comprises synchronizing dynamically changing the delay code to a divided clock domain of the divided clock.

11. The method of claim 9, wherein the method further comprises bypassing the high-speed input clock when delay shifting is not performed.

* * * * *